United States Patent [19]
Carley
[11] 3,740,621
[45] June 19, 1973

[54] TRANSISTOR EMPLOYING VARIABLE RESISTANCE BALLASTING MEANS DEPENDENT ON THE MAGNITUDE OF THE EMITTER CURRENT

[75] Inventor: Donald Raymond Carley, Somerville, N.J.
[73] Assignee: RCA Corporation, New York, N.Y.

[22] Filed: Aug. 30, 1971
[21] Appl. No.: 176,176

[52] U.S. Cl... 317/235 R, 317/235 Z, 317/235 AE, 317/235 Y, 317/235 D
[51] Int. Cl......................... H01l 11/00, H01l 15/00
[58] Field of Search .................... 317/234, 235, 22, 317/40.12, 40.13, 41

[56] References Cited

UNITED STATES PATENTS

| | | | |
|---|---|---|---|
| 3,090,873 | 5/1963 | MacKintosh | 317/235 AE |
| 3,243,669 | 3/1966 | Sah | 317/235 AE |
| 3,337,783 | 8/1967 | Stehney | 317/235 AE |
| 3,427,511 | 2/1969 | Rosenzweig | 317/235 |
| 3,460,007 | 8/1969 | Scott | 317/235 |
| 3,462,658 | 8/1969 | Worchel et al. | 317/235 |
| 3,519,898 | 7/1970 | Nakatani | 317/235 |
| 3,562,607 | 2/1971 | Iersel | 317/235 |

OTHER PUBLICATIONS

"Improved Transistor Structure," Technical Notes, by Olmstead June 4, 1969, page 1 to 3.

*Primary Examiner*—John W. Huckert
*Assistant Examiner*—Andrew J. James
*Attorney*—G. H. Bruestle

[57] ABSTRACT

A transistor includes emitter, base, and collector regions formed in a semiconductor body. The transistor has means coupled to the emitter region to provide a variable ballasting resistance which is dependent upon emitter current.

5 Claims, 3 Drawing Figures

INVENTOR.
DONALD R. CARLEY
BY Herbert L. Allen
ATTORNEY

TRANSISTOR EMPLOYING VARIABLE RESISTANCE BALLASTING MEANS DEPENDENT ON THE MAGNITUDE OF THE EMITTER CURRENT

BACKGROUND OF THE INVENTION

The present invention relates to semiconductor devices, and more particularly, relates to transistors designed to handle large amounts of power.

Transistors designed to handle relatively high power have been limited in their operating characteristics by an undesirable phenomenon known as second breakdown. Second breakdown is a device condition in which the emitter current concentrates in local regions of the emitter and locally overheats the transistor, often causing serious impairment or complete destruction of the device. This condition is characterized by an abrupt decrease in the collector-to-emitter voltage ($V_{ce}$) and a simultaneous increase in the emitter current $I_e$. The two second breakdown conditions, forward and reverse, depend upon the bias on the emitter.

More specifically, forward second breakdown occurs during forward-bias operation of the emitter, when the transverse electric field in the base region focuses the flow of current from the emitter to the collector into a narrow region under the emitter edge. When the current flows through the space charge region at the base-collector junction, a significant amount of heat is generated by the current-voltage product. With current flow focused into a small area, the heating effect is localized and hot spots at the emitter-base junction result. The current injection of these hot spots increases as their temperature increases, so that they draw more of the emitter current, and the hot spot temperatures thus rise progressively until the device is destroyed.

Reverse second breakdown occurs during the switching period of a reactively loaded transistor, when the emitter region is reverse-biased. The direction of the transverse field is reversed by the polarity change, thus focusing the emitter current into a small region in the center of the emitter. The same current concentration and hot spot phenomenon described above thus occurs at the center of the emitter, sometimes at lower power levels than in forward-bias operation. For a more detailed discussion of second breakdown, see W. Shockley, U. S. Pat. No. 3,286,138.

When second breakdown occurs, the output impedance of the transistor changes almost instantaneously from a large value to a small, limiting value. Second breakdown may be distinguished from normal transistor operation by the fact that once it occurs, the base current no longer controls normal collector current characteristics. Second breakdown is aggravated by imperfections in the device structure and is usually more severe in multiple diffused, high power devices.

Considerable improvement in the operating characteristics of power transistors has been achieved by increasing the ratio of emitter periphery to emitter area, in order to improve the internal heat dissipating ability of the device. Accordingly, a number of different emitter configurations have been adopted to secure relatively large emitter periphery.

Yet another improvement in second breakdown characteristics has been achieved by utilizing an emitter ballasting resistor in series with discrete portions of the emitter, in order to limit the maximum current that can flow between the emitter contact and the emitter-base junction. For example, see Scarlett, U. S. Pat. No. 3,358,197 and Nakatani, U. S. Pat. No. 3,519,898. However, the resistance value of prior art emitter ballasting resistors is independent of voltage or current. Thus, the emitter ballasting resistor in prior art devices introduces a resistance through the entire area of operation of the transistor, and is most effective only at higher emitter currents ($I_e$).

THE DRAWING

DETAILED DESCRIPTION

Figure 1:
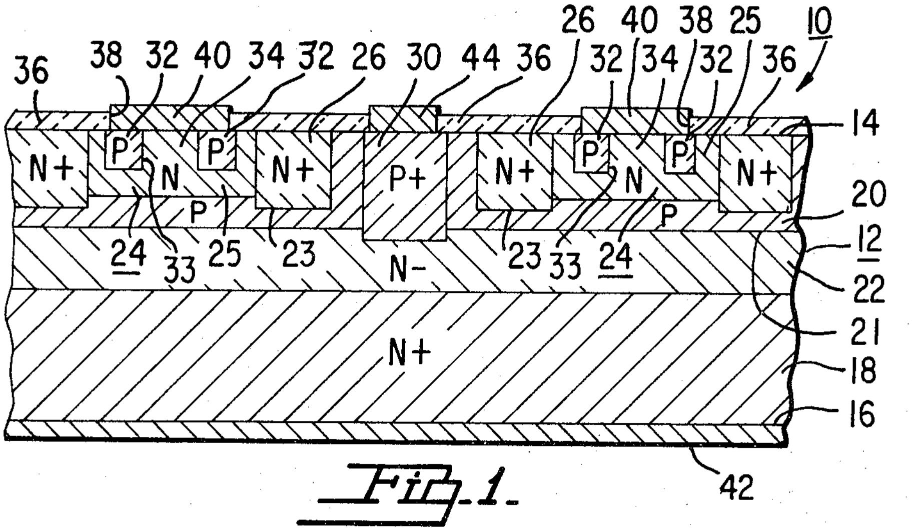
FIG. 1 is a cross-section of an overlay transistor employing the present invention.

One embodiment of the ballasted transistor of the present invention will be described with reference to FIG. 1 which illustrates an overlay transistor 10 having current variable resistance means electrically coupled to the emitter region, to provide a ballasting resistance which is dependent upon emitter current when the transistor is operating in a circuit. The transistor 10 may be an NPN or PNP device; however, an NPN device is shown in FIG. 1 and described below. Further, while the transistor 10 is described as having an overlay emitter geometry, it will be understood that the present invention may also be used with other emitter geometries, such as the interdigitated variety, for example.

The ballasted transistor 10 is formed in a semiconductor body 12 having upper and lower surfaces 14 and 16, respectively. An N type collector region is formed within the body 12, and comprises an N+ substrate 18 adjacent the lower surface 16 and an N− layer 22 adjacent the substrate 18. The transistor 10 also includes a base region 20 with a base-collector PN junction 21 between the base region 20 and the N− layer 22. A plurality of N type emitter regions 24 extend into the base region 20 from the upper surface 14, with an emitter-base PN junction 23 between each emitter region 24 and the base region 20. It is particularly suitable for this invention that each emitter region 24 include a relatively low conductivity central subregion 25, and a relatively high conductivity subregion 26 surrounding the low conductivity subregion. This emitter structure is commonly referred to as the "two conductivity emitter" and is disclosed in U. S. Pat. No. 3,427,511 to Rosensweig, which is assigned to the assignee of the present invention. The (standard overlay) structure of the transistor 10 also includes a highly conductive P+ grid region 30 extending into the base region 20 and surrounding each emitter region 24; the grid region 30 serves to conduct base current.

The transistor 10 further comprises variable resistance means coupled to the emitter regions 25 which is dependent upon emitter current when the transistor 10 is operating in a circuit. In this embodiment, the means comprises an annular region 32, of a conductivity type opposite to that of the emitter region 24 (P type, in this example) extends into the low conductivity subregion 25 and completely surrounds a central emitter portion 34. This region 32 establishes a PN junction 33 within the emitter region 24. An insulating coating 36, e.g., silicon dioxide, overlies the upper surface 14 and has a plurality of openings 38, with each opening extending to the P type region 32 and the central emitter portion 34 at the upper surface 14. A conductive emitter contact 40, such as a metal layer, is deposited in each opening 38 to short the P type region 32 and the central emitter portion 34. Collector and base electrodes 42 and 44 make contact to those respective regions.

The ballasted transistor 10, when operating in a circuit, functions in the following manner. During forward bias operation of the emitter base regions 23, conventional emitter current ($I_e$) flows from the emitter electrode 40 through the central emitter portion 34, into the low conductivity emitter subregion 25, and through the high conductivity subregion 26, where current is injected across the emitter-base junction 23. When one of the emitter regions 24 begins to develop the local hot spots which lead to second breakdown, the current flowing through the emitter portion 34 and underneath the P region 32 increases rapidly. However, since the emitter contact 40 also contacts the annular P region 32, the PN junction 33 is shorted. Therefore, as emitter current through the emitter portion 34 increases, a nonuniform depletion region spreads inwardly into the emitter portion 34 and also towards the emitter-base junction 23. This in turn reduces the effective cross section of the emitter portion 34 and the low conductivity subregion 25 underneath the P region 32, which increases the effective resistance between the emitter electrode 40 and the periphery of the emitter-base junction 23. The value of this resistance is therefore dependent on emitter current and limits that current in the desired manner.

Further, as this depletion region spreads to a limiting point either across the central emitter portion 34, or through the low conductivity emitter subregion 25, emitter current is effectively "pinched-off" so that for further increases in base-to-emitter voltage, the emitter current between the contact 40 and the emitter-base junction 23 remains substantially constant below the second breakdown limit of the transistor 10.

Figure 2:
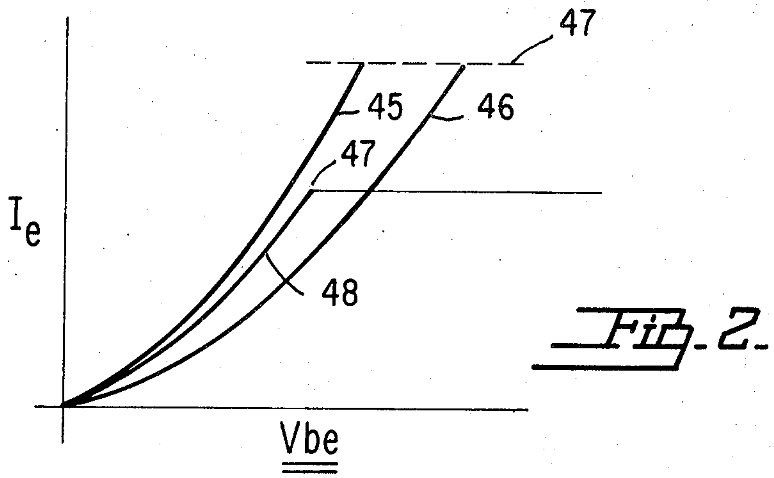
FIG. 2 is a set of I–V curves illustrating characteristics of prior art transistors and that of the present invention.

FIG. 2 illustrates the emitter current, $I_e$, (ordinate) versus base-to-emitter voltage, $V_{be}$, (abscissa) characteristic curves for three transistor cases. A first one of the curves 45 depicts a typical $I_e$—$V_{be}$ characteristic for an unballasted transistor operating at a constant collector-to-emitter voltage level. A second one of the curves 46 depicts a typical transistor ballasted by means which are independent of emitter current. While this type of ballasting increases the effective $V_{be}$ capability of the transistor, the device is still subject to second breakdown, since, in either of these two cases, once emitter current reaches a limiting level (shown arbitrarily by a dotted line 47 in FIG. 2), second breakdown occurs.

The third curve 48 illustrates the transistor 10 of FIG. 1 ballasted with emitter current dependent means in accordance with the present invention. This curve 48 acts as a typical ballasted device until a limiting point 49 is reached, where the depletion region within the emitter region spreads across either the central emitter portion 34 or through the low conductivity emitter subregion 25 to pinch-off the emitter current. For further increases in $V_{be}$ beyond the limiting point 49 which is below the second breakdown limit of the device, emitter current remains constant.

The transistor 10 can be made by well known semiconductor fabrication techniques which do not constitute a part of the invention. For example, the overlay transistor structure can be made in accordance with the teachings of U. S. Pat. No. 3,434,019 to Carley. The emitter and base contacts may comprise a refractory metal such as tungsten, which can be deposited in the manner taught by Amick in U. S. Pat. No. 3,477,872.

Figure 3:
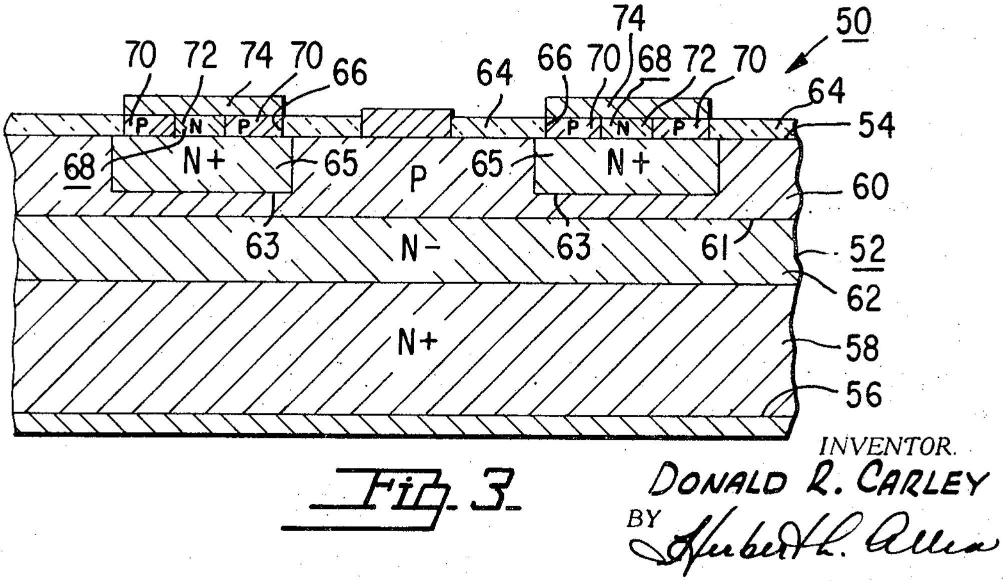
FIG. 3 is a cross-section of a transistor employing a second embodiment of the invention.

A second embodiment of the invention is shown in FIG. 3. An emitter current dependent ballasted transistor 50 is formed in a semiconductor body 52 having upper and lower surfaces 54 and 56, respectively. The transistor 50 has a collector-base structure like the transistor 10 of FIG. 1, which includes an N+ collector substrate 58, N− collector region 62, and a P type base region 60 with a base-collector PN junction 61 between the base and collector regions.

In this embodiment, although the plan configuration is not shown, the emitter is a standard interditigated structure and includes several emitter fingers 65 (two of which are shown in cross-section in FIG. 3) extending into the base region 60 from the upper surface 54, and forming an emitter-base junction 63. An insulating coating 64 overlies the upper surface 54 and has a plurality of slots 66 therein which extend through the coating to each emitter finger 65.

The transistor 50 further comprises a layer 68 of semiconductor material, as monocrystalline silicon, for example, is disposed in each slot 66 and on the emitter 65. This layer 68 includes an outer peripheral portion 70 of a conductivity type opposite to the emitter fingers 65, and a central portion 72 of the same conductivity type as the emitter fingers 65. A conductive emitter contact 74 overlies and shorts both portions 70, 72 of the semiconductor layer 68.

This embodiment of the invention functions in a manner similar to the transistor 10 in FIG. 1 when operating in a circuit. Specifically, as emitter current increases through the central portion portio 72, a depletion region spreads from the peripheral portion 70 and ultimately "pinches-off" the emitter current when it reaches a limiting point.

Other structural arrangements are possible within the scope of this invention. For example, in the transistor 10 of FIG. 1, the shorted opposite conductivity type region 32 may be disposed in the central portion of the emitter region with the emitter contact shorting the emitter region at the periphery thereof. Likewise, the P and N portions 70, 72 of the semiconductor layer 68 in the transistor 50 of FIG. 3 may also be interchanged.

I claim:

1. A transistor, comprising:
- a semiconductor body having a surface;
- a collector first region of a first conductivity type in said body;
- a base second region of a second conductivity type in said body adjacent said collector region with a base-collector PN junction therebetween, said base region extending to said surface;
- an emitter third region of said first conductivity type extending into said base region from said surface with an emitter-base PN junction therebetween;
- a fourth semiconductor region of said second conductivity type extending into said emitter region from said surface and terminating short of said emitter-base PN junction; said fourth region being of annular shape and surrounding a portion of said emitter region extending to said surface.

an emitter electrode disposed on said fourth region and said portion of said emitter region at said surface; and electrode means contacting said base and collector regions.

2. A transistor according to claim 1, wherein said emitter electrode is disposed only on said fourth region and said emitter portion.

3. A transistor according to claim 2, wherein said emitter region comprises:

a low conductivity subregion including said portion extending through said annular region; and a high conductivity subregion surrounding said low conductivity subregion.

4. A transistor, comprising:

a semiconductor body having a surface;

a collector region of a first conductivity type in said body;

a base region of a second conductivity type in said body adjacent said collector region with a base-collector PN junction therebetween, said base region extending to said surface;

an emitter region of said first conductivity type extending into said base region from said surface with an emitter-base PN junction therebetween;

a semiconductor layer disposed on said emitter region at said surface, said layer including a portion of said first conductivity type and a portion of said second conductivity type, both of said portions contacting said emitter region; and an emitter electrode disposed in contact with both of said portions.

5. A transistor according to claim 4, wherein said first conductivity portion comprises a central region of said layer between said electrode and said emitter region, and wherein said second conductivity portion comprises an annular region surrounding said central region.

* * * * *